United States Patent
New

(10) Patent No.: US 6,242,945 B1
(45) Date of Patent: Jun. 5, 2001

(54) FIELD PROGRAMMABLE GATE ARRAY WITH MASK PROGRAMMABLE I/O DRIVERS

(75) Inventor: Bernard J. New, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/589,146

(22) Filed: Jun. 7, 2000

Related U.S. Application Data

(62) Division of application No. 09/236,767, filed on Jan. 25, 1999, now Pat. No. 6,091,262, which is a division of application No. 08/811,483, filed on Mar. 4, 1997, now Pat. No. 5,874,834.

(51) Int. Cl.$^7$ ........................................................ G06F 7/38
(52) U.S. Cl. ................................ 326/39; 326/38; 326/40; 326/41
(58) Field of Search ................................ 326/38, 39, 40, 326/41

(56) References Cited

U.S. PATENT DOCUMENTS

| | | |
|---|---|---|
| 5,267,187 | 11/1993 | Hsieh et al. . |
| 5,296,759 | 3/1994 | Sutherland et al. . |
| 5,640,327 | * 6/1997 | Ting ........................................ 364/488 |
| 5,649,219 | 7/1997 | Matsushima . |
| 5,825,202 | * 10/1998 | Tavana et al. ........................... 326/39 |
| 5,959,466 | * 9/1999 | McGowan ............................... 326/39 |
| 6,094,066 | * 7/2000 | Mavis ..................................... 326/41 |
| 6,150,837 | * 11/2000 | Beal et al. ............................... 326/39 |

FOREIGN PATENT DOCUMENTS

| | | |
|---|---|---|
| 57055625 | 4/1982 | (EP) . |
| WO 95/16993 | 6/1995 | (WO) . |
| WO 98/38741 | 9/1998 | (WO) . |

OTHER PUBLICATIONS

Barbara Tuck, "Low Power, Density, and Better Tools Propel Cell–Based ASICs", Computer Design, vol. 35, No. 13, Dec. 1996, pp. 79–80, 82, 84, 86, 88–89.

IBM, "Mixture of Field and Factory Programmed Logic Cells in a Single Device", IBM Technical Disclosure Bulletin, vol. 38, No. 4, Apr. 1995, pp. 499.

"The Programmable Logic Data Book", 1996, available from Xilinx, Inc., 2100 Logic Drive, San Jose, California 95124, pp. 4–1 through 4–45.

* cited by examiner

Primary Examiner—Patrick Wamsley
Assistant Examiner—Vibol Tan
(74) Attorney, Agent, or Firm—E. Eric Hoffman, Esq.; Edel M. Young

(57) ABSTRACT

A field programmable gate array (FPGA) having a plurality of configurable logic blocks (CLBs). Each of the CLBs includes programmable interconnect resources, a field programmable configurable logic element (CLE) circuit and a corresponding non-field programmable gate array. The programmable interconnect resources are programmed to selectively couple or decouple each CLE circuit from its corresponding non-field programmable gate array. Dedicated interconnect resources enable adjacent non-field programmable gate arrays to be coupled. By coupling adjacent non-field programmable gate arrays, one or more relatively large non-field programmable gate arrays can be formed. The non-field programmable gate arrays have a greater logic density than the CLE circuits, thereby providing an improved logic density to the CLBs. Moreover, because each CLB includes a non-field programmable gate array, each of the CLE circuits is readily connectable to a non-field programmable gate array. The non-field programmable gate array can be used to provide a plurality of mask-programmable input/output driver circuits for connection to the pads of the FPGA.

5 Claims, 9 Drawing Sheets

FIELD PROGRAMMABLE GATE ARRAY WITH MASK PROGRAMMABLE I/O DRIVERS

CROSS-REFERENCE TO RELATED APPLICATIONS

This application is a divisional application of U.S. patent application Ser. No. 09/236,767, invented by Bernard J. New and filed Jan. 25, 1999, now 6,091,262 which is a divisional of U.S. patent application Ser. No. 08/811,483, invented by Bernard J. New and filed Mar. 4, 1997, now U.S. Pat. No. 5,874,834 both which are incorporated herein by reference.

FIELD OF THE INVENTION

The present invention relates to a field programmable gate array (FPGA) architecture. More specifically, the present invention relates an FPGA which includes a dedicated gate array functionality.

BACKGROUND OF THE INVENTION

FIG. 1 is a block diagram of a portion of a conventional FPGA 100. The FPGA 100 typically includes a two dimensional array of configurable logic blocks (CLBs), which includes CLBs 101A–101I as illustrated. Each of these CLBs 101A–101I includes a block of configurable logic elements (CLEs) and corresponding programmable routing resources. For example, CLB 101A includes CLE 102 and routing resources 103. The routing resources associated with the various CLBs can be programmed by the user to provide various connections among the CLEs. In addition, the user can program the CLEs to implement different functions.

The flexibility provided by CLBs 101A–101I comes at the cost of logic density. For example, suppose that the CLBs 101A–101E are configured to implement an adder function having a certain number of bits. The CLBs required to implement such an adder function will have a larger layout area than a dedicated adder function having the same number of bits. FPGA 100 exhibits a reduced logic density with respect to dedicated circuits because of the additional resources required to make the routing resources and the CLEs programmable.

As an alternative to FPGAs, non-field programmable gate arrays can be programmed to implement application specific functions. The function of a non-field programmable gate array is defined during the later stages of manufacture, after a defined pattern of transistors has been formed. (A field programmable gate array, as its name implies, is programmed by the user.) An example of a non-field programmable gate array is a sea-of-gates (SOG) gate array, which is a mask programmed gate array.

An SOG gate array, in which a pattern of transistors are interconnected by custom patterns of metal lines, has a significantly higher logic density than the CLBs 101A–101I of FPGA 100. In an SOG gate array, a predefined pattern of transistors are connected directly with user-defined metal, both to form gates and to interconnect those gates. Consequently, the extensive programmable routing resources required for FPGA 100 are not present in an SOG gate array. However, non-field programmable gate arrays, such as SOG gate arrays, are inflexible in that they do not provide for field programmability.

FPGAs and non-field programmable gate arrays have been combined in a single device as set forth by Tavana et al. in U.S. Pat. No. 5,825,202 issued Oct. 20, 1998. However, this patent describes an FPGA portion of the device which is located within one dedicated region, and a non-field programmable gate array portion of the device which is located within a separate dedicated region. These dedicated regions are laterally separated, such that a common boundary separates the FPGA portion from the non-field programmable gate array portion. As a result of this layout, all interconnections between the FPGA portion and the non-field programmable gate array portion must cross the common boundary. This requirement can result in interconnect congestion, which in turn, can result in interconnect routing limitations.

It would therefore be desirable to have an FPGA which exhibits the field programmability of a conventional FPGA, as well as the improved logic density of a non-field programmable gate array, without exhibiting excessive congestion within the interconnect structure.

SUMMARY

Accordingly, the present invention provides an FPGA having a plurality of CLBs. Each of the CLBs includes programmable interconnect resources, a field programmable configurable logic element (CLE) circuit and a corresponding non-field programmable gate array, such as a mask programmed gate array, or more specifically, a sea-of-gates (SOG) gate array. Each of the non-field programmable gate arrays is relatively small in silicon area. However, the non-field programmable gate arrays in the various CLBs can be connected (via user-defined metal interconnects) to form one or more relatively large non-field programmable gate array circuits which are distributed throughout the FPGA. In one example, each of the non-field programmable gate arrays can include on the order of 100 gates. The logic density provided by the non-field programmable gate arrays (which is much greater than the logic density of the CLE circuits), can increase the logic density of the FPGA approximately five-fold in one embodiment of the invention.

The programmable interconnect resources include a plurality of interconnect segments and programmable switch points. The programmable switch points are programmable to selectively couple the interconnect segments, the CLE circuits and the non-field programmable gate arrays. The following configurations can be implemented by appropriately programming the programmable switch points: (1) the interconnect segments can provide signals to the CLE circuit and/or the non-field programmable gate array; (2) the non-field programmable gate array can provide signals to the CLE circuit or the interconnect segments; and (3) the CLE circuit can provide signals to the interconnect segments and/or the non-field programmable gate array. A large degree of interconnection flexibility is therefore available within the FPGA.

Because each of the CLBs includes a non-field programmable gate array, the non-field programmable gate array functionality is effectively distributed over the entire FPGA. Moreover, because each of the CLBs includes a non-field programmable gate array, each of the CLE circuits is readily connectable to a non-field programmable gate array.

The present invention will be more fully understood in view of the following detailed description taken together with the drawings.

DETAILED DESCRIPTION

Figure 2:
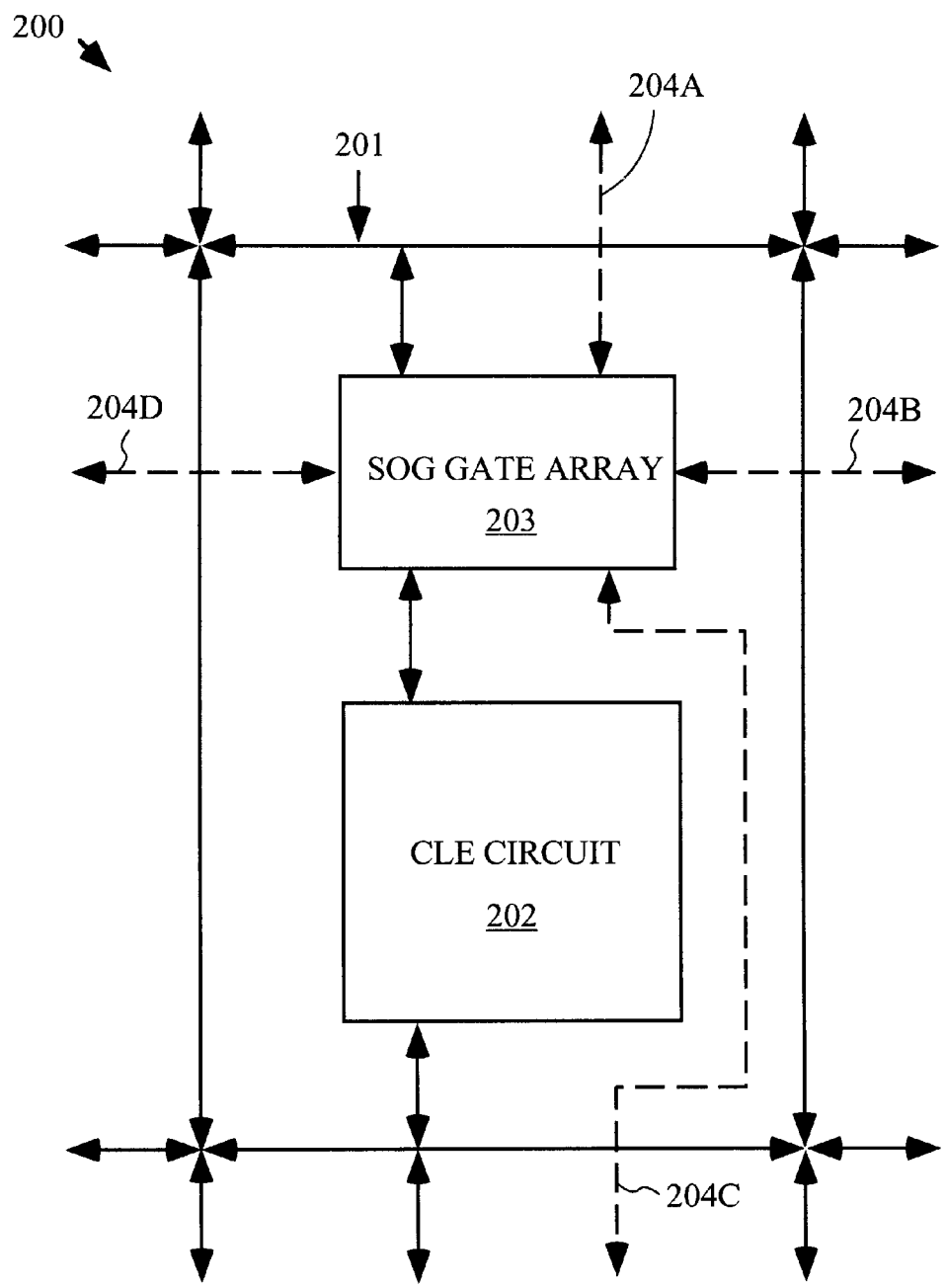
FIG. 2 is a block diagram of a CLB having a dedicated SOG gate array in accordance with one embodiment of the invention.

FIG. 2 is a block diagram of a configurable logic block (CLB) 200 in accordance with one embodiment of the invention. CLB 200 includes programmable interconnect resources 201, field programmable configurable logic element (CLE) circuit 202, non-field programmable sea-of-gates (SOG) gate array 203 and dedicated SOG interconnect resources 204A–204D. CLE circuit 202 is connected to the programmable interconnect resources 201 and the SOG gate array 203. The SOG gate array 203 is connected to the dedicated SOG interconnect resources 204A–204D. These connections are described in more detail below. Although the present invention is described in connection with a non-field programmable gate array which is an SOG gate array 203, it is understood that this SOG gate array 203 can be replaced with other types of non-field programmable gate arrays in other embodiments of the invention.

In general, the CLE circuit 202 and the SOG gate array 203 are made up of a plurality of active and passive circuit elements, such as transistors, diodes, capacitors and resistors, which are fabricated in a semiconductor substrate using conventional semiconductor processing methods. Programmable interconnect resources 201 and dedicated SOG interconnect resources 204A–204D are made up of conductive traces which are formed in one or more interconnect layers over the semiconductor substrate in accordance with conventional semiconductor processing techniques.

Figure 3:
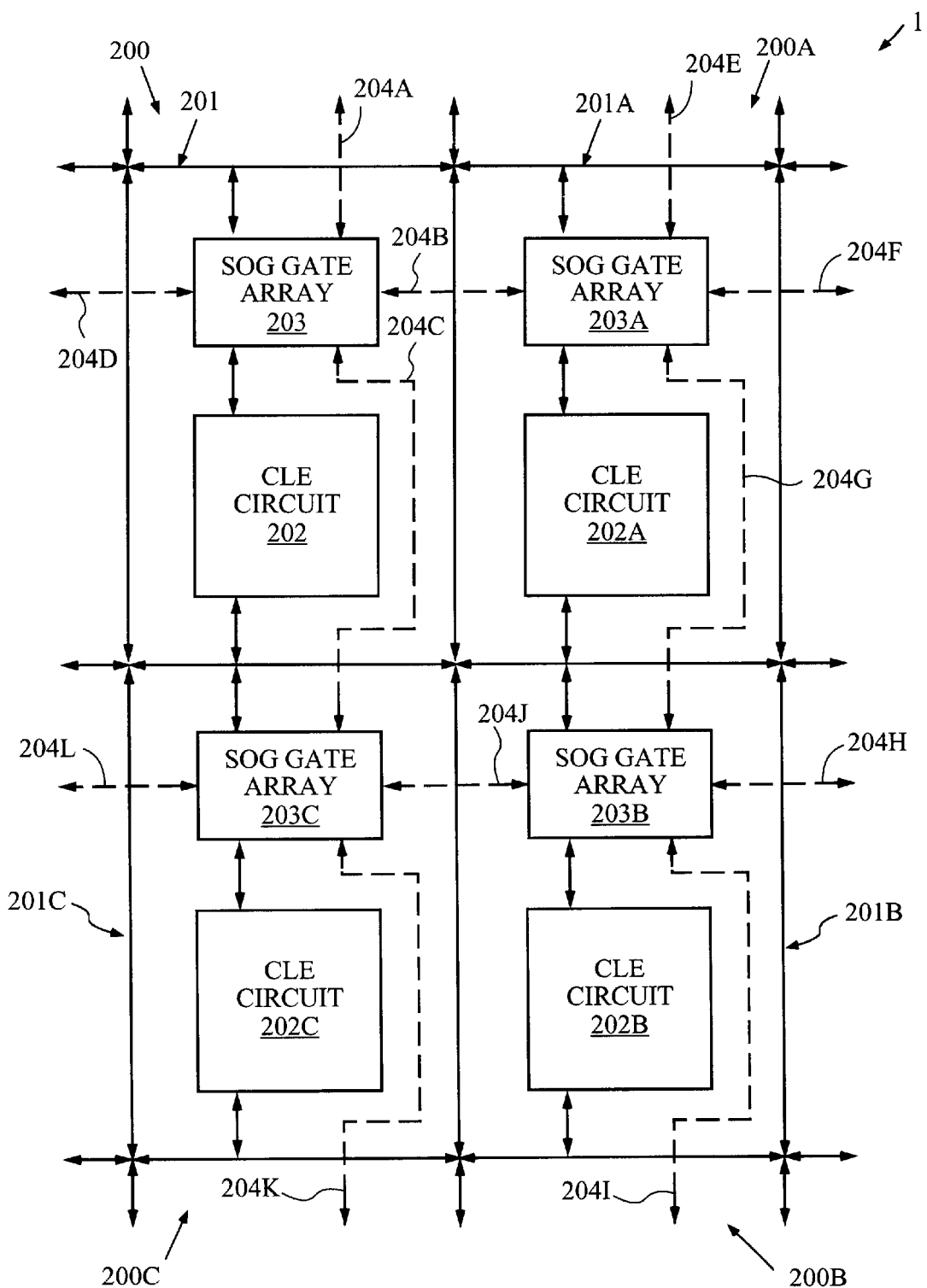
FIG. 3 is a block diagram of a portion of an FPGA which utilizes the CLB of FIG. 2.

FIG. 3 is a block diagram of a portion of an FPGA 1 which utilizes CLB 200. The illustrated portion of FPGA 1 includes four adjacent CLBs 200, 200A, 200B and 200C, which are arranged in a grid pattern. CLBs 200A, 200B and 200C include corresponding programmable interconnect resources 201A, 201B and 201C, CLE circuits 202A, 202B and 202C, and SOG gate arrays 203A, 203B and 203C, as illustrated. Interconnect resources 201, 201A, 202A and 201C are shared by the adjacent CLB circuits 200, 200A, 200B and 200C as illustrated. Similarly, the SOG interconnect resources 204A–204L are shared by SOG gate arrays in adjacent CLBs. Thus, SOG gate arrays 203, 203A, 203B and 203C are connected by SOG interconnect resources 204B, 204C, 204G and 204J. By connecting the relatively small SOG gate arrays in adjacent CLBs, a relatively large SOG gate array can be implemented on FPGA 1. Moreover, because each CLE circuit has a corresponding SOG gate array located in the same CLB, each of the CLE circuits has ready access to this large SOG gate array.

Figure 4:
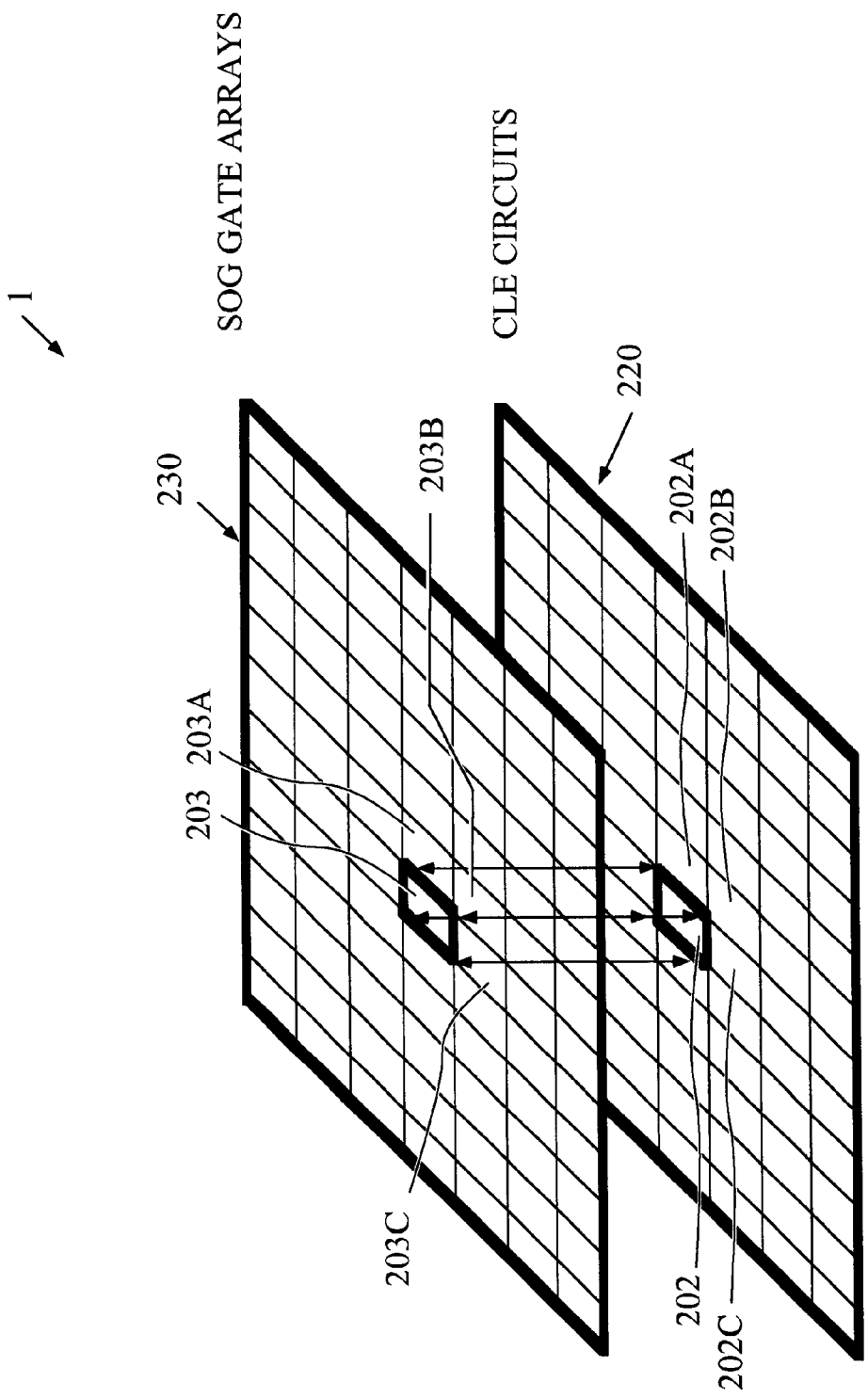
FIG. 4 is a schematic diagram illustrating a large SOG gate array and a large CLE circuit which are formed by the CLBs of FIG. 3.

FIG. 4 is a schematic diagram illustrating a large SOG gate array 230 which can be implemented by coupling the SOG gate arrays present in the CLBs in accordance with one embodiment of the present invention. The large SOG gate array 230 includes SOG gate arrays 203, 203A, 203B, and 203C, as well as SOG gate arrays present in surrounding CLBs. A large CLE circuit 220 can also be implemented by coupling the various CLE circuits through the (programmable) FPGA routing. Thus, the large CLE circuit 220 includes CLE circuits 202, 202A, 202B and 202C, as well as the CLE circuits present in surrounding CLBs. The arrows extending between CLE circuit 202 and corresponding SOG gate array 203 indicate that CLE circuit 202 can be coupled to the large SOG gate array 230 through the corresponding SOG gate array 203. In a similar manner, each of the CLE circuits present in the large CLE circuit 220 can be connected to the large SOG gate array 230 through a corresponding SOG gate array.

Figure 5:
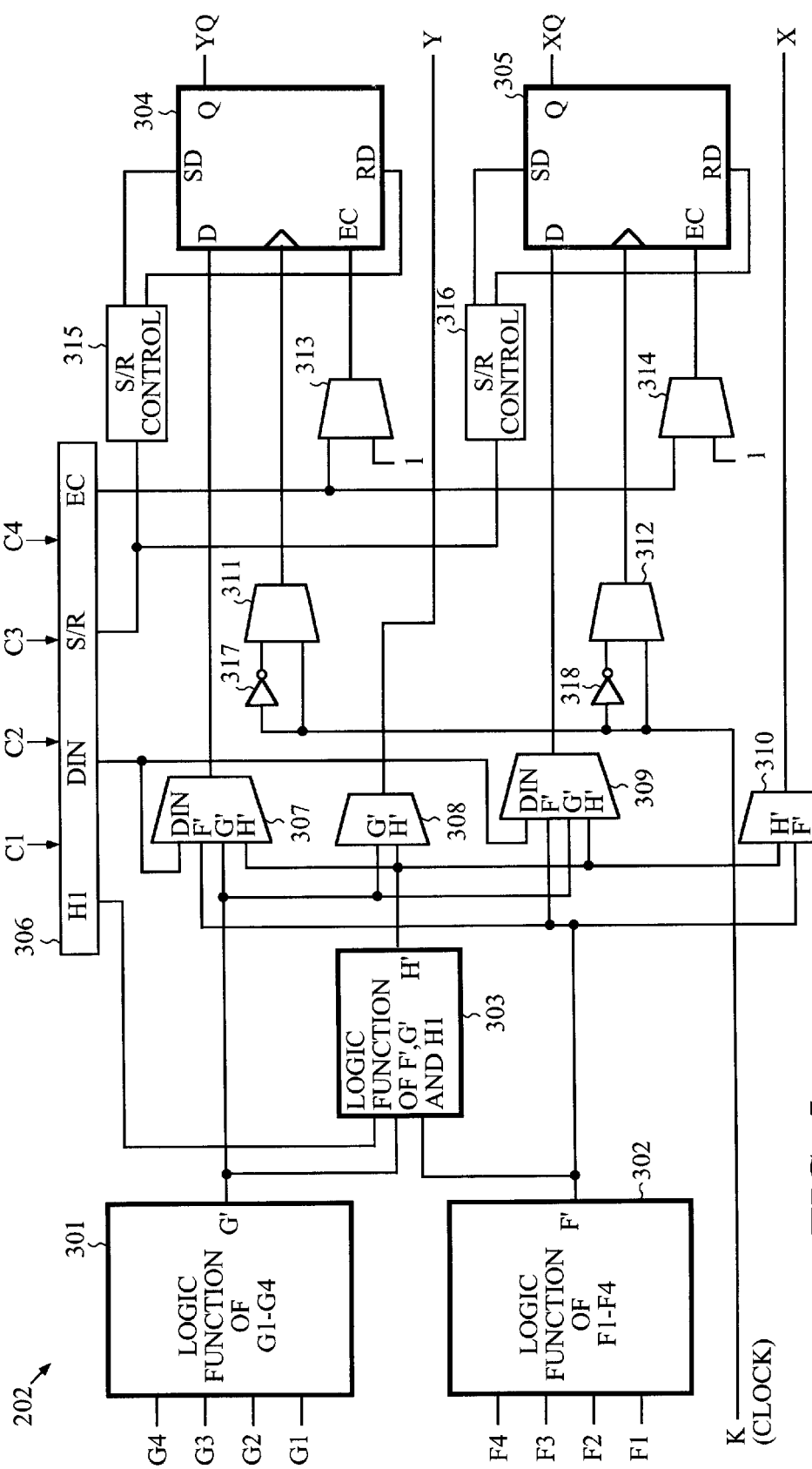
FIG. 5 is a schematic diagram of the CLE circuit of FIG. 2 in accordance with one embodiment of the invention.

CLB 200 will now be described in more detail. FIG. 5 is a schematic diagram of CLE circuit 202 in accordance with one embodiment of the invention. Although the present invention is described in connection with a particular CLE circuit, it is understood that in other embodiments of the invention, other CLE circuits can be used. The CLE circuit 202 illustrated in FIG. 5 is a conventional circuit which is used in the XC4000 family of FPGAs provided by Xilinx, Inc., assignee of the present invention. The Xilinx XC4000 family of products is described at pages 4-1 through 4-45 of the Xilinx Programmable Logic Data Book copyright 1996. (Note: the term CLB as used in the Xilinx Data Book does not include routing and thus corresponds to the term CLE as used herein.) CLE circuit 202 includes function generators 301–303, flip-flops 304–305, programmable switch 306, multiplexers 307–314, set/reset (S/R) control circuits 315–316 and inverters 317–318.

CLE circuit 202 includes thirteen input terminals (which receive the input signals labeled F1–F4, G1–G4, C1–C4 and K) and four output terminals (which provide the output signals labeled X, Y, XQ and YQ). These input and output terminals provide access to the function generators 301–303 and flip flops 304–305. These input and output terminals are further connected to the programmable interconnect resources 201 located outside of the CLE circuit 202.

In general, the CLE circuit 202 operates as follows. Programmable switch 306 maps four control input signals C1–C4 into four internal control signals H1, DIN, S/R and EC in any arbitrary manner. Function generator 301 receives the four input signals G1–G4 and provides an output signal G'. Similarly, function generator 302 receives the four input signals F1–F4 and provides an output signal F'. Each of function generators 301–302 is capable of implementing any arbitrarily defined Boolean function of their four input signals. Function generator 303 receives input signals F', G' and H1, and in response, provides an output signal H' which can be any Boolean function of these three input signals. The F1' or H' signal is routed through multiplexer 310 to the X output terminal. The G' or H' signal is routed through multiplexer 308 to the Y output terminal.

Flip flops 304 and 305 are edge-triggered D-type flip-flops which operate in response to a clock signal, a clock enable (EC) signal, a data signal D, a set (SD) signal and a reset (RD) signal. Each flip flop can be triggered on either the rising or falling clock edge as determined by inverters 317–318 and multiplexers 311–312. The set and reset signals are provided by S/R control circuits 315–316 in response to the internal S/R control signal. The flip flops are either enabled by the internal EC control signal, or continuously enabled, as determined by the settings of multiplexers 313–314. The data signals D provided to flip flops 304 and 305 are selected from the signals F', G', H' and control signal DIN as determined by the settings of multiplexers 307 and 309. Multiplexers 307–314 are set during the initial configuration of the CLE circuit 202. The CLE circuit 202 provides the logical equivalent of approximately 25 logic gates.

Figure 1:
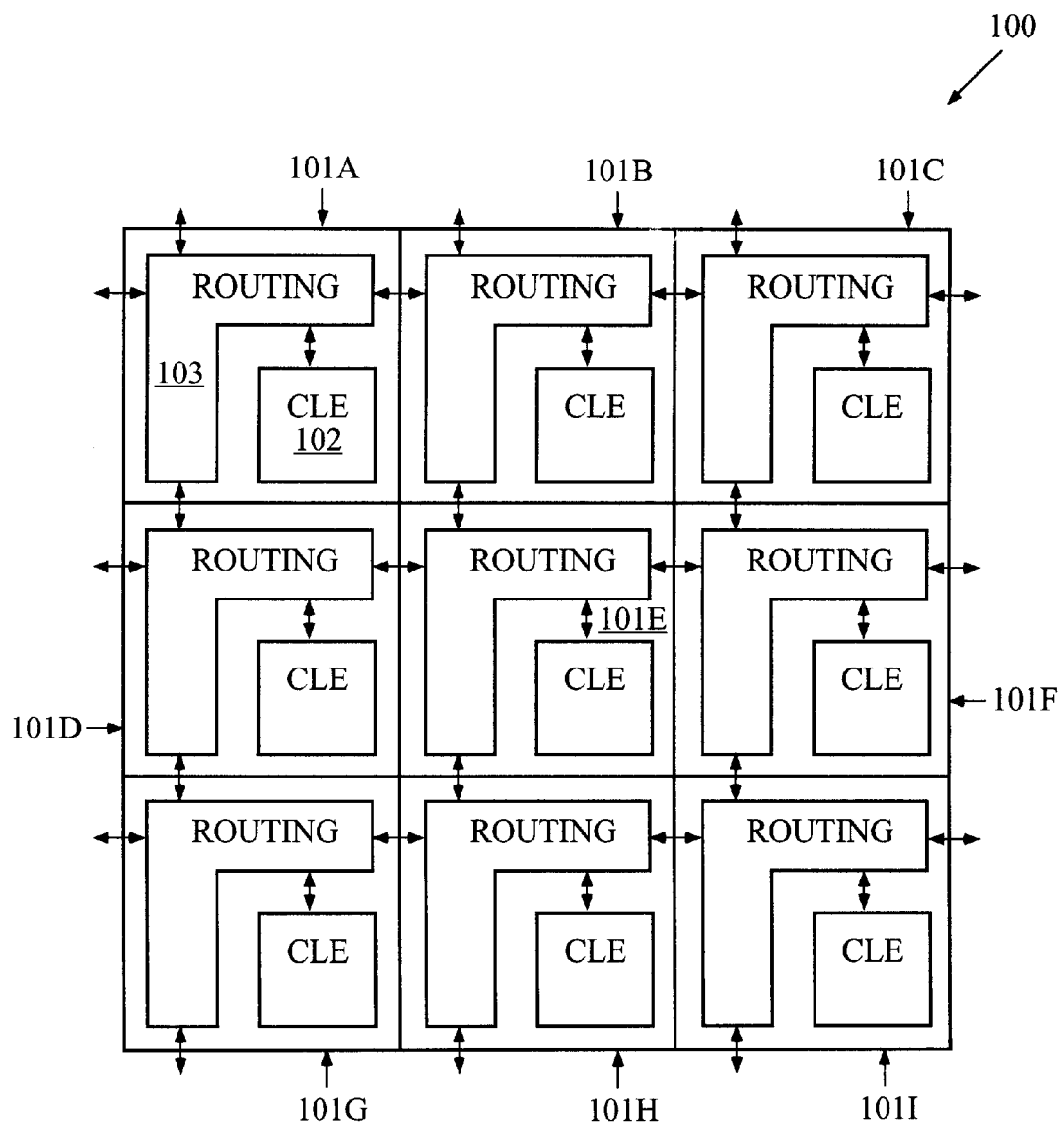
FIG. 1 is a block diagram of a portion of a conventional FPGA.

The CLE circuit 202 can be programmed to implement any number of functions, either by itself, or in combination with other CLE circuits (e.g., CLE circuits 202A, 202B and 202C of FIG. 3). Functions which can be performed by the CLE circuits include, but are not limited to, a decoder, an accumulator, a multiplexer, an unidirectional loadable counter, an up/down counter, an adder, or a memory. Each four-input function generator can generate over 15,000 different functions. Consequently, the number of functions that can be performed by CLE circuit 202 is very large. Returning now to FIG. 2, the SOG gate array 203 provides a dedicated, high density array of gates which are configured to implement fixed logic functions. The SOG gate array 203 can have, for example, on the order of 100 gates. The configuration of the SOG gate array 203 is determined by the manner in which the gates are interconnected by a dedicated mask-defined interconnect structure. The particular layout of the gates provided by SOG gate array 202 can be dependent upon the logic function or functions to be provided by the SOG gate array 203. For example, the SOG gate array 203 can be arranged to provide a dedicated block of memory, at a logic density which is much greater than the logic density of CLE circuit 202. In other embodiments, the SOG gate array 203 can be used to implement other dedicated functions which would otherwise be provided by the CLE circuits, but at a much greater logic density. Thus, array multipliers and large random access memories, which are not cost efficient to implement using CLE circuits, can be implemented by the SOG gate arrays in a cost effective manner. In general, the area of CLB 200 is approximately 10% greater than a conventional CLB 100 (FIG. 1). However, the logic density of CLB 200 is approximately three to ten times greater than the logic density of conventional CLB 100. Other ratios are possible and considered to be within the scope of the present invention. In general, the ratio of the logic density of an SOG gate array to a CLE circuit is approximately 40:1.

Figure 6A:
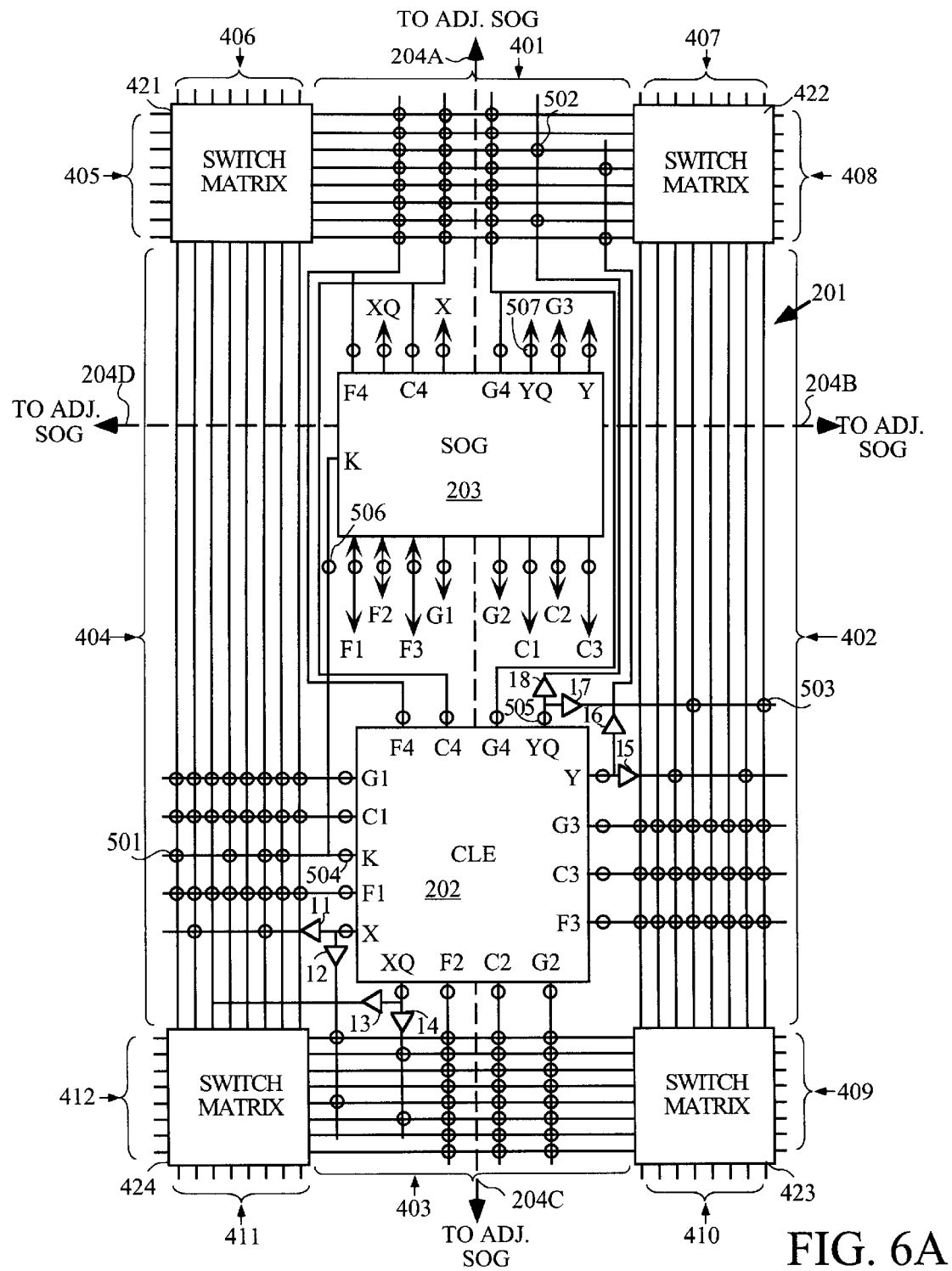
FIG. 6A is a block diagram illustrating programmable connections within the CLB of FIG. 3 in accordance with one embodiment of the invention.

FIG. 6A is a block diagram illustrating the connections between programmable interconnect resources 201, CLE circuit 202, SOG gate array 203, and SOG interconnect segments 204A–204D in accordance with one embodiment of the invention. As previously described, the input terminals (which receive signals C1–C4, F1–F4, G1–G4, K) and the output terminals (which provide signals X, XQ, Y, YQ) of the CLE circuit 202 are connected to the programmable interconnect resources 201 located outside of the CLE circuit 202. The programmable interconnect resources 201 are composed of a plurality of interconnect segments 401–412, switching matrices 421–424 and programmable switch points (illustrated as small circles in FIG. 6A) to implement the desired routing. Each of the interconnect segments 401–412 includes a plurality of interconnect lines.

The switching matrices 421–424, which are located at the corners of the grid formed by the programmable interconnect resources 201, consist of programmable pass transistors (not shown) which are used to selectively establish connections between the lines of the interconnect segments 401–412. Although the interconnect segments of programmable interconnect resources 201 are illustrated as single-length segments which span a single CLE circuit before entering a switch matrix, it is understood that these lines may pass through a switch matrix and may, for example, extend across two CLE circuits (double-length lines) or across the entire length or width of the FPGA (long-lines) before terminating in a switch matrix.

The switching points, which are shown as small circles in FIG. 6A, can be implemented, for example, using anti-fuses or transistors, or may be metal mask programmed. In the described embodiment, the switching points are normally-open connection points which can be programmed to form closed connections. In general, the switching points can be classified as one of three types of switching points, including segment switching points, CLE switching points and SOG switching points.

Segment switching points, when programmed, provide a selective connection from the interconnect segments to the CLE circuit 202 and/or the SOG gate array 203. In FIG. 6A, the segment switching points are located at intersections of the interconnect segments 401–404 and the lines which extend to the CLE circuit 202 and the SOG gate array 203. For example, connection points 501, 502 and 503 are segment switching points. In the described embodiment, it is assumed that signals pass through the segment switching points in a unidirectional manner. The direction of signal transfer for each of these unidirectional segment switching points is determined by the type of the terminal to which the switching point is coupled. For example, the segment switching points which are coupled to the input terminals (which receive the input signals labeled F1–F4, G1–G4, C1–C4 and K) will pass signals from the interconnect segments 401–404 to the CLE circuit 202 (or the SOG gate array 203). Similarly, the segment switching points which are coupled to the output terminals (which provide the output signals labeled X, Y, XQ and YQ) will pass signals from the CLE circuit 202 (or the SOG gate array 203) to the interconnect segments 401–404. In other embodiments, the CLE circuit 202 and segment switching points can be modified to pass signals in a bidirectional manner.

CLE switching points, when programmed, provide a selective connection between the CLE circuit 202 and the interconnect segments 401–404 and/or the SOG gate array 203. In FIG. 6A, the CLE switching points are illustrated around the periphery of the CLE circuit 202. For example, connection points 504 and 505 are CLE switching points. The output terminals of the CLE circuit 202 are coupled to output buffers 11–18 as illustrated.

Figure 6B:
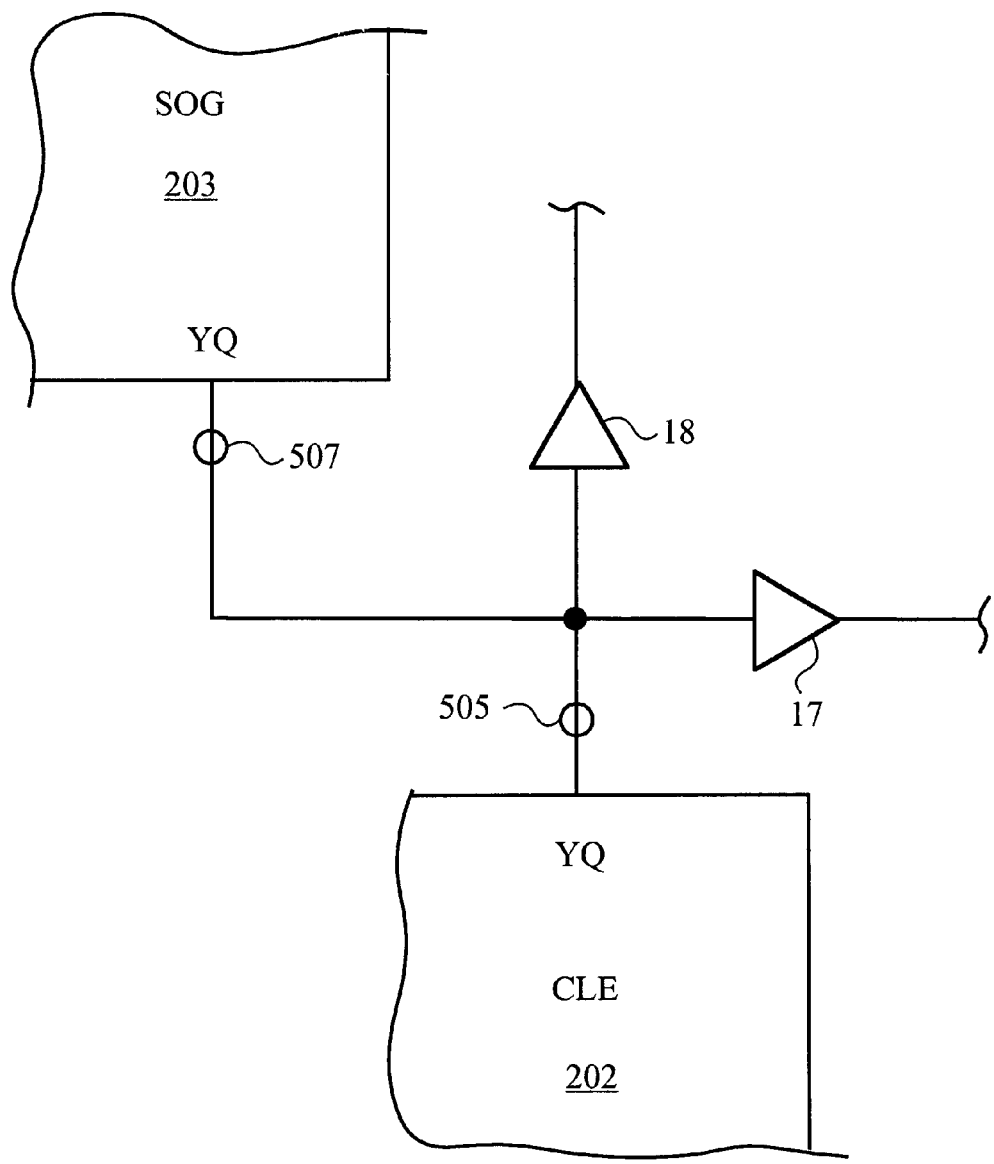
FIG. 6B is a block diagram illustrating connections for an output terminal of the CLB of FIG. 6A.

SOG switching points, when programmed, provide a selective connection between the SOG gate array 203 and the CLE circuit 202 or the interconnect segments 401–404. In general, this is accomplished by programming a segment switch point, as well as a corresponding CLE switch point and/or a corresponding SOG switch point. In FIG. 6A, the SOG switching points are illustrated around the periphery of the SOG gate array 203. For example, switching points 506 and 507 are SOG switching points. The SOG switching points corresponding to the output terminals of the CLE circuit 202 (i.e., the SOG switching points coupled to the terminals labeled X, Y, XQ and YQ) are coupled to the input terminals of the output buffers 11–18. FIG. 6B is a block diagram illustrating the connections between CLE switching point 505, SOG switching point 507 and output buffers 17–18. Similar connections are provided for the CLE and SOG switching points associated with output terminals X, Y and XQ.

The switching points can be programmed as set forth in the following examples. First, the switching points can be programmed such that the programmable interconnect resources 201 provide input signals to the input terminals of CLE circuit 202 and/or the terminals of the SOG gate array 203. In general, this is accomplished by programming a segment switch point, as well as a corresponding CLE switch point and/or a corresponding SOG switch point. For example, the outermost line of interconnect segment 404 can provide an input signal K to CLE circuit 202 if segment switch point 501 and CLE switch point 504 are programmed. Alternatively, the outermost line of interconnect segment 404 can provide an input signal K to SOG gate array 202 if segment switch point 501 and SOG switch point 506 are programmed. Finally, the outermost line of interconnect segment 404 can provide an input signal K to both CLE circuit 202 and SOG circuit 203 if segment switch point 501, CLE switch point 504 and SOG switch point 506 are all programmed.

Second, the switching points can be programmed such that the SOG gate array 203 provides an input signal to an input terminal of the CLE circuit 202 or an output signal to the programmable interconnect resources 201. This is generally accomplished by programming an SOG switch point, as well as a corresponding CLE switch point or a corresponding segment switch point. For example, SOG gate array 203 can provide a signal to the input terminal K of CLE circuit 202 if SOG array 203 has been customized during manufacturing to provide an output signal on its K terminal and SOG switch point 506 and CLE switch point 504 are programmed. Alternatively, SOG gate array 203 can provide an output signal YQ to the outermost line of interconnect segment 402 if SOG switch point 507 and segment switch point 503 are programmed (and CLE switch point 505 is not programmed).

Third, the switching points can be programmed such that the output terminals of the CLE circuit 202 are connected to the programmable interconnect resources 201 and/or the SOG gate array 203. This is generally accomplished by programming a CLE switch point, as well as a corresponding segment switch point and/or SOG switch point. For example, the CLE circuit 202 will provide output signal YQ to interconnect segment 401 and interconnect segment 402 if CLE switch point 505 is programmed and segment switch points 502 and 503 are also programmed. Alternatively, CLE circuit 202 can provide output signal YQ to SOG gate array 203 if CLE switch point 505 and SOG switch point 507 are programmed. Finally, CLE circuit 202 can provide output signal YQ to the interconnect segments 401–402 and to SOG gate array 203 if the CLE switch point 505, the segment switch points 502 and 503, and the SOG switch point 507 are all programmed.

There is therefore a broad range of possible interconnections between the interconnect resources 201, the CLE circuit 202 and the SOG gate array 203.

As illustrated by dashed lines in FIG. 6A, dedicated interconnect segments 204A–204D extend from the SOG gate array 203 to SOG gate arrays in adjacent CLBs. Each of interconnect segments 204A–204D includes a plurality of conductive traces fabricated in an interconnect layer of the FPGA. Interconnect segments 204A–204D enable the effective size of the SOG gate array 203 to be expanded by joining the SOG array 203 of CLB 200 with other SOG gate arrays in adjacent CLBs. As a result, the SOG gate array 203 can effectively be combined with other SOG gate arrays in other CLBs to form a larger SOG gate array circuit, such as SOG gate array circuit 230 (FIG. 4). Interconnect segments 204A–204D are mask defined as part of the SOG design to allow the connections between the adjacent SOG gate arrays to be selectively determined. That is, a conventional SOG interconnect structure is fabricated between adjacent SOG gate arrays. Moreover, interconnect segments, such as interconnect segments 204A–204D enable the SOG gate arrays to be partitioned into several distinct SOG gate array circuits. This advantageously increases the configuration possibilities of the FPGA 1. Moreover, by locating an SOG gate array 203 and a CLE circuit 202 in each of the CLBs, each CLE circuit advantageously has access to the large SOG gate array.

Figure 7:
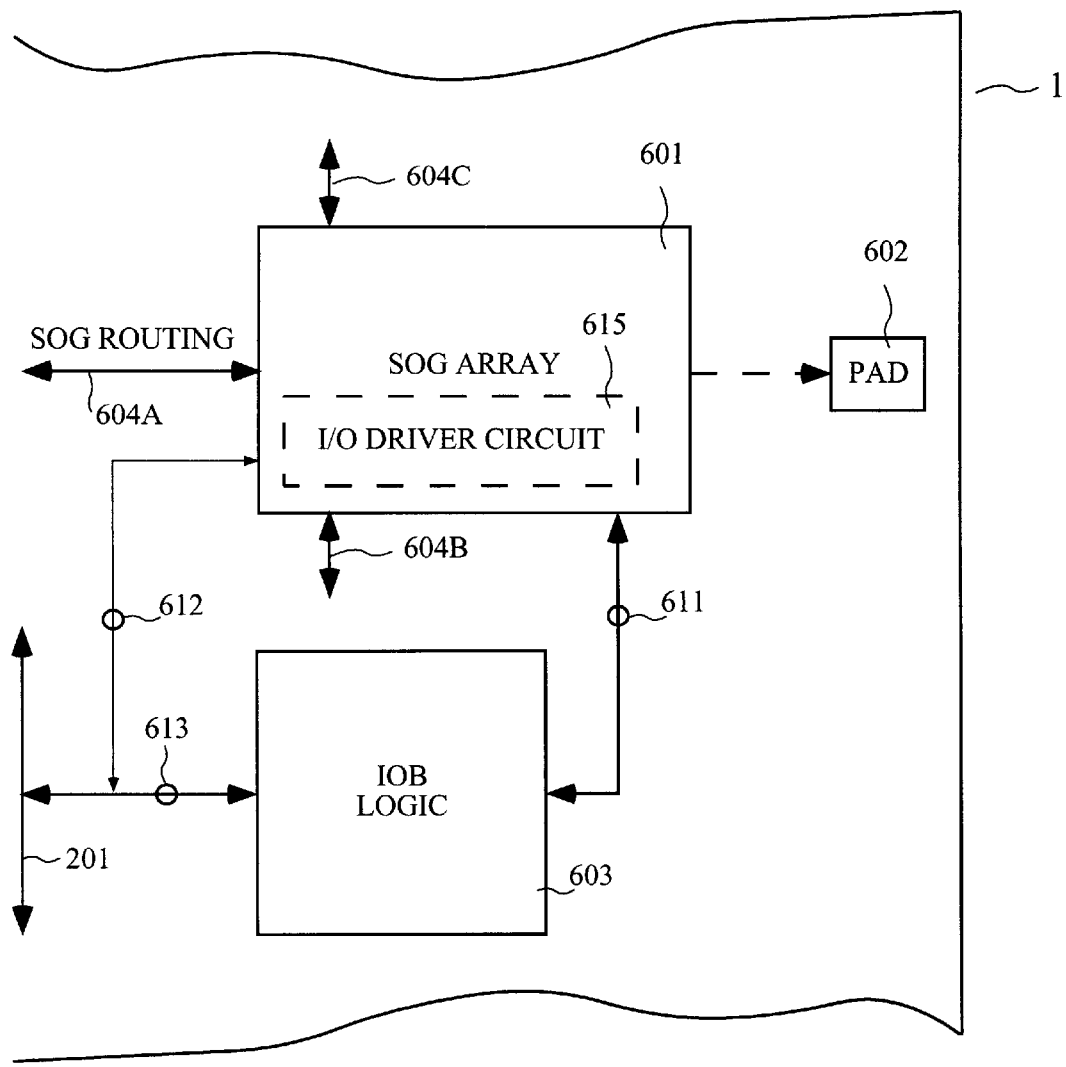
FIG. 7 is a block diagram a pad, an SOG gate array and an input/output buffer logic circuit in accordance with one embodiment of the invention.

In accordance with another embodiment of the present invention, one or more SOG gate arrays can be provided at the periphery of the FPGA 1 to provide interfaces to the input/output (I/O) pads of the FPGA 1. These SOG gate arrays can be viewed as being part of the large SOG gate array 230 (FIG. 4). FIG. 7 is a block diagram of an SOG gate array 601 which is located at the periphery of the FPGA 1. SOG gate array 601 is coupled to an I/O pad 602. SOG gate array 601 is further coupled to other SOG gate arrays through the mask-programmed dedicated SOG interconnect resources 604A–604C. SOG gate array 601 is also coupled to an input/output buffer (IOB) logic circuit 603 through a first set of programmable connections 611, and to the programmable interconnect resources 201 through a second set of programmable connections 612. IOB logic circuit 603 is coupled to the programmable interconnect resources 201 through a third set of programmable connections 613. As described in more detail below, the SOG gate array 601 can be mask-programmed to implement an input and/or output driver circuit 615 which is coupled to the I/O pad 602. In general, IOB logic circuit 603 provides an interface between the pad 602 (i.e., an external pin of the FPGA 1) and the internal logic of the FPGA 1. Each pad has a corresponding IOB logic circuit which can be defined for input, output, or bi-directional signals.

Pad 602 can be coupled to interconnect resources 201 through SOG gate array 601 by programming the second set of programmable connections 613. Alternatively, pad 602 can be coupled to interconnect resources through SOG gate array 601 and IOB logic circuit 603 by programming the first and third sets of programmable connections 611 and 613.

Figure 8:
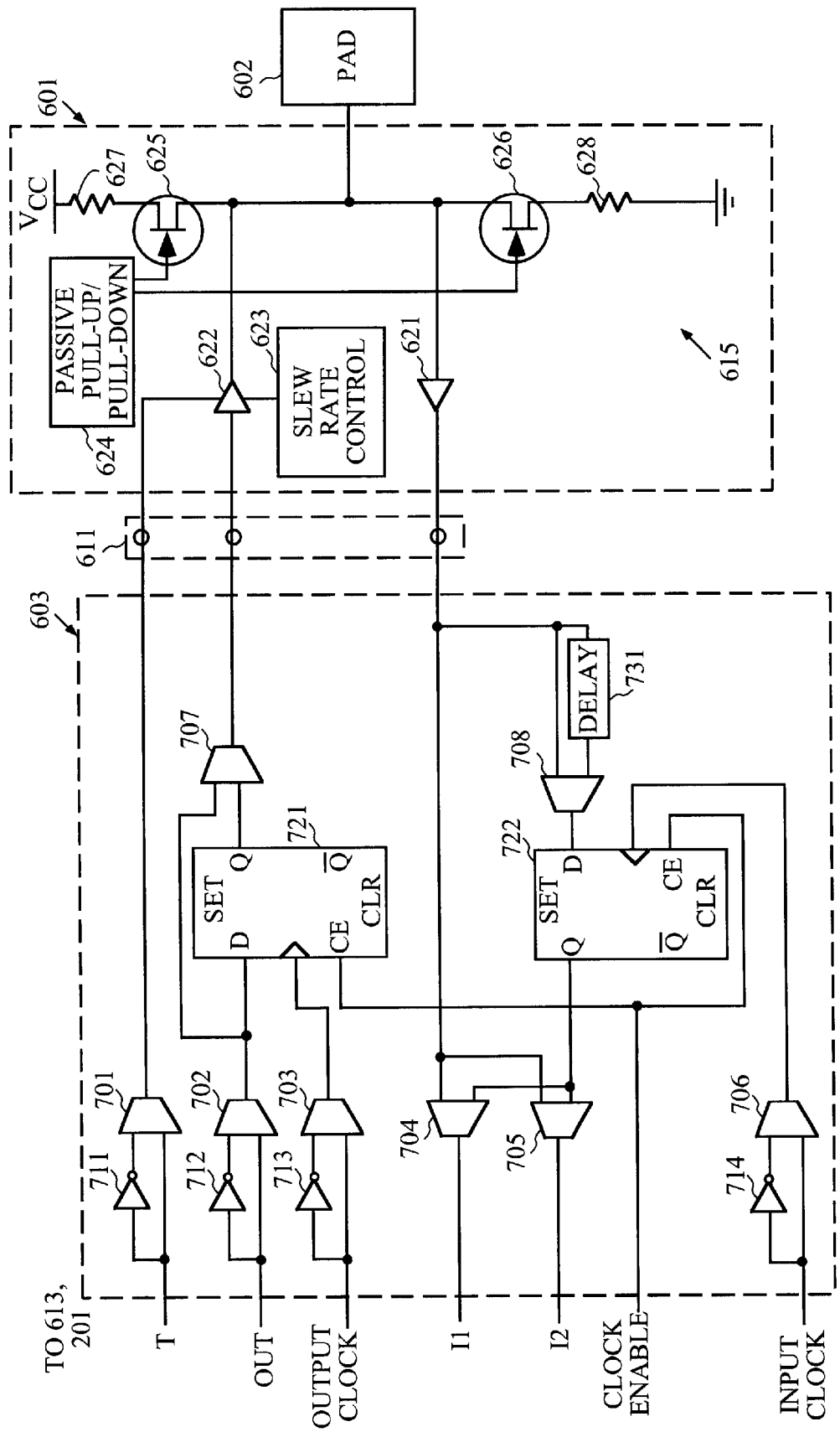
FIG. 8 is a schematic diagram of the elements of FIG. 7 in accordance with one embodiment of the invention.

FIG. 8 is a schematic diagram of SOG gate array 601, I/O pad 602 and IOB logic circuit 603 in accordance with one embodiment of the present invention. In this embodiment, SOG gate array 601 is connected to form a driver circuit 615 which includes input buffer 621, output buffer 622, slew rate control circuit 623, passive pull-up/pull-down circuit 624, transistors 625–626 and resistors 627–628. The SOG gate array 601 includes logic elements which can be programmed to vary the composition of the input buffer 621 and the output buffer 622. For example, these buffers 621 and 622 can be conventional TTL buffers or non-TTL buffers, depending upon the manner in which the SOG gate array 601 is programmed. The composition of the input and output buffers 621 and 622 can be programmably selected on a pad-by-pad basis. Thus, the I/O driver circuits of the FPGA can be designed pad by pad by the user, and manufactured to interface with a board at specific voltages (e.g., ECL, TTL, or low voltage.) Moreover, differential signalling can be implemented using two pads of the FPGA (not shown), with each pad being driven by a dedicated SOG gate array circuit. The pair of SOG gate array circuits, in turn, are driven by a common IOB logic circuit. Consequently, SOG gate array 601 advantageously provides flexibility in selecting the operating characteristics of the driver circuit 615.

IOB logic circuit 603 includes multiplexers 701-708, inverters 711–714, flip flops 721–722 and delay circuit 731. Flip flops 721 and 722 are clocked by an input clock signal and an output clock signal, respectively, which are received from the interconnect resources 201. The input clock signal or its inverse (as provided by inverter 714) is routed through multiplexer 706 to the clock input terminal of flip flop 722. Similarly, the output clock signal or its inverse (as provided by inverter 713) is routed through multiplexer 703 to the clock input terminal of flip flop 721. Flip flops 721 and 722 are enabled by a clock enable signal received from the interconnect resources 201.

Within IOB logic circuit 603, two paths, labeled I1 and I2, provide input signals to the interconnect resources 201 of the FPGA 1. The input signal provided by input buffer 621 can be provided directly to paths I1 and I2 through multiplexers 704 and 705. Alternatively, the input signal provided by the input buffer 621 can be routed to paths I1 and I2 through multiplexer 708, flip flop 722 (which can be programmed as either an edge triggered flip-flop or a level sensitive transparent latch), and multiplexers 704 and 705. The input signal provided to flip flop 722 can be delayed by several nanoseconds to compensate for the delay on the input clock signal, which must pass through a global buffer (not shown) before arriving at the IOB logic circuit 603. The output signal OUT received from the interconnect resources 201 or its inverse (as provided by inverter 712) can pass directly through multiplexers 702 and 707 to output buffer 622. Alternatively, the output signal OUT (or its inverse) can be routed through multiplexer 702, flip flop 721 and multiplexer 707 to output buffer 622. An output enable signal T (or its inverse as provided by inverter 711) is provided to enable output buffer 622 or place the output buffer 622 in a high impedance state. Slew rate control circuit 623 enables the slew rate of the output buffer 622 to be reduced to minimize power transients when switching noncritical signals. Passive pull-up/pull-down circuit 624 can assert a logic high signal to transistor 625 or 626, thereby causing the pad 601 to be pulled up to $V_{cc}$ through resistor 627 or pulled down to ground through resistor 628 in the event that pad 602 is not used. In other embodiments, IOB logic circuit 603 can be modified to include other circuitry, as required by the design of the particular FPGA.

Although the invention has been described in connection with several embodiments, it is understood that this invention is not limited to the embodiments disclosed, but is capable of various modifications which would be apparent to one of ordinary skill in the art. Thus, the invention is limited only by the following claims.

What is claimed is:

1. A field programmable gate array (FPGA) comprising:
an input/output (I/O) pad;
a non-field-programmable gate array circuit coupled to the I/O pad, wherein the non-field programmable gate array circuit is mask-programmable to implement a driver circuit;
a set of field programmable connections for connecting the non-field programmable gate array circuit to field programmable interconnect resources of the FPGA; and
a set of mask programmable connections for connecting the driver circuit to non-field programmable logic circuits of the FPGA.

2. The FPGA of claim 1 further comprising an input/output buffer (IOB) logic circuit coupled to the non-field programmable gate array circuit, wherein the IOB logic circuit buffers signals to and from the non-field programmable gate array circuit.

3. The FPGA of claim 2 further comprising a first set of programmable connections for connecting the non-field programmable gate array circuit to the IOB logic circuit.

4. The FPGA of claim 1 further comprising a plurality of configurable logic blocks (CLBs), each comprising a field programmable configurable logic element (CLE) circuit, the CLBs being coupled to the field programmable interconnect resources of the FPGA.

5. The FPGA of claim 4 wherein each of the CLBs further comprises a local non-field programmable gate array circuit coupled to a corresponding CLE circuit, the FPGA further comprising mask-programmable connections for coupling the non-field programmable gate array circuit to at least one of the local non-field programmable gate array circuits.

* * * * *